(12) United States Patent
Jacquet et al.

(10) Patent No.: US 9,935,192 B2
(45) Date of Patent: Apr. 3, 2018

(54) OPTIMIZED BUFFER LAYER FOR HIGH MOBILITY FIELD-EFFECT TRANSISTOR

(71) Applicants: THALES, Courbevoie (FR); COMMISSARIAT A l'ENERGIE ATOMIQUE ET AUX ENERGIES ALTERNATIVES, Paris (FR)

(72) Inventors: Jean-Claude Jacquet, Orsay (FR); Raphaël Aubry, Gometz le Chatel (FR); Piero Gamarra, Palaiseau (FR); Olivier Jardel, Palaiseau (FR); Stéphane Piotrowicz, Magny les Hameaux (FR)

(73) Assignees: THALES, Courbevoie (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/300,712

(22) PCT Filed: Apr. 3, 2015

(86) PCT No.: PCT/EP2015/097004
§ 371 (c)(1),
(2) Date: Sep. 29, 2016

(87) PCT Pub. No.: WO2015/150582
PCT Pub. Date: Oct. 8, 2015

(65) Prior Publication Data
US 2017/0110565 A1    Apr. 20, 2017

(30) Foreign Application Priority Data

Apr. 4, 2014 (FR) ..................... 14 00825

(51) Int. Cl.
*H01L 29/36* (2006.01)
*H01L 29/778* (2006.01)
(Continued)

(52) U.S. Cl.
CPC ...... *H01L 29/7787* (2013.01); *H01L 29/2003* (2013.01); *H01L 29/205* (2013.01); *H01L 29/36* (2013.01)

(58) Field of Classification Search
CPC ............... H01L 29/7787; H01L 29/205; H01L 29/2003; H01L 29/36; H01L 29/365; H01L 29/7272; H01L 29/7789
See application file for complete search history.

(56) References Cited

U.S. PATENT DOCUMENTS

2010/0289067 A1   11/2010   Mishra et al.
2012/0025268 A1   2/2012    Ichikawa
(Continued)

*Primary Examiner* — Caridad Everhart
(74) *Attorney, Agent, or Firm* — Baker & Hostetler LLP

(57) ABSTRACT

A stack along a z-axis for a high-electron-mobility field-effect transistor, comprises: a buffer layer comprising a first semiconductor material comprising a binary, ternary or quaternary nitride compound having a first bandgap, a barrier layer comprising a second semiconductor material comprising a binary, ternary or quaternary nitride compound and having a second bandgap, the second bandgap wider than the first bandgap, a heterojunction between the buffer and barrier layers and, a two-dimensional electron gas located in an XY plane perpendicular to the z-axis and in the vicinity of the heterojunction wherein: the buffer layer comprises a zone comprising fixed negative charges of density per unit volume higher than or equal to $10^{17}$ cm$^{-3}$, the zone having a thickness smaller than or equal to 200 nm, the product of multiplication of the density per unit volume of fixed negative charges by the thickness of the zone between $10^{12}$ cm$^{-2}$ and $3.10^{13}$ cm$^{-2}$.

14 Claims, 8 Drawing Sheets

(51) Int. Cl.
*H01L 29/20* (2006.01)
*H01L 29/205* (2006.01)

(56) References Cited

U.S. PATENT DOCUMENTS

2013/0200389 A1    8/2013  Lee
2013/0328106 A1   12/2013  Kokawa et al.
2017/0018617 A1*   1/2017  Xia ...................... H01L 29/404

* cited by examiner

OPTIMIZED BUFFER LAYER FOR HIGH MOBILITY FIELD-EFFECT TRANSISTOR

CROSS-REFERENCE TO RELATED APPLICATIONS

This application is a National Stage of International patent application PCT/EP2015/097004, filed on Apr. 3, 2015, which claims priority to foreign French patent application No. FR 1400825, filed on Apr. 4, 2014, the disclosures of which are incorporated by reference in their entirety.

FIELD OF THE INVENTION

The present invention relates to high-electron-mobility field-effect transistors (i.e. HEMTs).

The present invention more particularly relates to the stacks from which HEMTs used as low-noise or power amplifiers, as switches or as oscillators covering the frequency range typically comprised between 1 MHz and 100 GHz are fabricated.

BACKGROUND

FIG. 1 schematically shows a cross section through the structure of a conventional elementary HEMT transistor system in an Oxz plane, the transistor being produced on a substrate 11. Conventionally, an insulating or semiconductor substrate 11 is used, for example comprising silicon (Si), silicon carbide (SiC) or sapphire ($Al_2O_3$), on which substrate a stack of at least two semiconductor layers is produced along the z-axis, said layers extending in the Oxy plane.

A first layer 12, denoted the buffer layer, has a wide bandgap (it is what is called a wide bandgap semiconductor material) and for example comprises a binary nitride compound material such as GaN or a material based on a ternary III-nitride compound (denoted a III-N) such as AlGaN or more precisely $Al_xGa_{1-x}N$.

A second layer, denoted the barrier layer 13, has a wider bandgap than that of the buffer layer 12. This layer comprises a material based on a quaternary, ternary or binary III-nitride compound (denoted a III-N) based on Al, Ga, In or B.

For example, with a GaN buffer layer, the barrier layer comprises $Al_xGa_{1-x}N$ or $In_{1-x}Al_xN$, or a $In_{1-x}Al_xN/AlN$ or $Al_xGa_{1-x}/AlN$ sequence.

Depending on their aluminum content x, the bandgap widths of $Al_xGa_{1-x}N$ and $In_{1-x}Al_xN$ vary from 3.4 eV (GaN) to 6.2 eV (AlN) and from 0.7 eV (InN) to 6.2 eV (AlN), respectively.

The thickness of the barrier layer 13 is typically comprised between 5 nm and 40 nm and the thickness of the buffer layer 12 is typically comprised between 0.2 μm and 3 μm.

Additional layers may be present either on the surface of the device, or between the buffer layer and the barrier layer.

The buffer layer 12 and the barrier layer 13 are conventionally produced epitaxially by MOCVD or MBE. By way of example, mention may be made of a GaN-based buffer layer with a barrier layer based on AlGaN or InAlN, and more precisely based on $Al_xGa_{1-x}N$ or d'$In_zAl_{1-z}N$, with x typically comprised between 15% and 35% and z typically comprised between 15% and 25%.

The junction between the buffer layer and the barrier layer forms a heterojunction 15 that also extends in the Oxy plane. The origin O of the coordinate system Oxyz is expressly placed in this plane.

A HEMT transistor conventionally comprises a source S, a drain D and a gate G, which are deposited on the top side 14 of the barrier layer 13.

The gate G is deposited between the source S and the drain D and allows the transistor to be controlled. The conductance between the source S and the drain D is modulated by the electrostatic action of the gate G, which is conventionally a Schottky contact or MIS (metal/insulator/semiconductor) stack, and the voltage $V_{GS}$ applied between the gate and the source controls the transistor.

A two-dimensional electron gas 9 (denoted a 2DEG) is located in the vicinity of the heterojunction 15. These electrons are mobile in the Oxy plane and have a high electron mobility μe, typically higher than 1000 $cm^2$/Vs. In normal transistor operation, these electrons are unable to flow in the z-direction because they are confined in the potential well that forms in the Oxy plane in the vicinity of the heterojunction 15. The electron gas 9, which is confined in what is denoted the channel of the transistor, is therefore able to transport a current $I_{DS}$ between the drain and the source. Conventionally, a potential difference $V_{DS}$ is applied between the source S and the drain D, the source S typically being grounded, and the value of the current $I_{DS}$ depends on the voltage $V_{GS}$ applied between the gate G and the source S.

The transistor effect is based on the modulation of the conductance gm between the contacts S and D by the electrostatic action of the control electrode G. The variation in this conductance is proportional to the number of free carriers in the channel, and therefore to the current between the source and drain. It is this transistor amplification effect that allows a weak signal applied to the gate to be converted into a stronger signal picked up at the drain.

FIG. 2 shows the charge distribution in the vicinity of the heterojunction. Materials of the III-N family are highly electronegative. When two different compounds of this family are brought into contact, a fixed electrical charge that is either positive (σ+) (FIG. 2) or negative (σ−) appears at there interface. This fixed charge attracts mobile charges (electrons when it is positive such as in FIG. 2 or holes when it is negative). It is these mobile charges em that create a current when a voltage is applied between the drain and the source.

GaN is a semiconductor that, under conventional growth conditions, is doped with donor-type impurities (n-type impurities) (typically nitrogen vacancies). This type of defect does not allow a confinement of the electrons in the channel to be obtained when the voltage applied to the drain of the transistor becomes too high (typically higher than 10 V) and when the length Lg of the gate becomes too small (typically smaller than 0.25 μm). The electrons then flow through the buffer layer, this leading to a decrease in the conductance gm of the transistor.

The effect that this poor confinement of electrons in the channel has on the transfer function $Log(I_{DS})=f(V_{GS})$ is to decrease the slope $gm=\Delta I_{DS}/\Delta V_{GS}$, such as illustrated in FIG. 3. This decrease is indicative of less effective modulation of the current by the gate.

Good transistor operation is obtained when curve 31 $Log(I_{DS})=f(V_{GS})$ has a steep slope (such as illustrated in FIG. 3) at high constant $V_{DS}$ (for example 20 V) and for a small gate length (for example smaller than 0.25 μm). This steep slope, which is representative of a high transconductance $g_m$, reflects the ability of the transistor to modulate high currents with a sufficient power gain at the operating point 30. In this case, the "pinch off" of the transistor is said to be good. Curve 32 illustrates a transistor exhibiting a poor "pinch off". It is possible to quantify this value by a quantity called the subthreshold wing. A value thereof lower than 150 mV/decade of current is sought.

To obtain a transistor operation with a subthreshold wing lower than 150 mV/decade for the desired operating voltages it is necessary to compensate the initial n-type doping.

A first solution is to p-dope the (GaN or $Al_xGa_{1-x}N$) buffer by introducing acceptor-type impurities, for example by modifying the epitaxial growth conditions or by adding, during the growth, acceptor-type impurities. The impurity density introduced into the buffer is optimized to obtain the desired transistor behavior.

Compatible impurities are mainly carbon and iron but may also be magnesium, beryllium or zinc or any impurities known to be an acceptor center in GaN.

Typically, an excess of p-type impurities with respect to the n-type impurities of a few $10^{16}$ cm$^{-3}$ to a few $10^{17}$ cm$^{-3}$ allows a subthreshold wing lower than 150 mV/decade to be obtained for maximum operating voltages of 50 V ($V_{DS}$) and gates of 0.15 μm length.

However, these impurities constitute deep centers. The expression "deep center" refers to an impurity the energy level of which is located more than 2 to 3 times the thermal activation energy (=3/2 $k_b$*T) from the minimum of the conduction band in the case of an n-type impurity, or from the maximum of the valence band in the case of a p-type impurity. At room temperature, the thermal activation energy is about 40 meV. A center will therefore be considered to be deep if it is located at more than 100 meV from one of these extrema, this being the case for GaN doped with acceptor-type impurities.

These centers charge negatively when the transistor is biased and, as they are deep, do not discharge at operating frequencies higher than 1 MHz. This has the effect of decreasing the mobile charge present in the conductive channel, thereby decreasing current and increasing access resistance. It follows that the main drawback of this approach, in addition to generating dispersion, is that it decreases the efficiency of the transistor and the power that it is able to emit. The severity of this degradation in performance increases as the operating voltage $V_{DS}$ of the transistor increases (typically higher than 20 V).

This decrease in the amount of mobile charge, referred to as "current collapse", is illustrated in FIG. 4. In this example the GaN buffer of the transistor is uniformly p-doped to a value of $5\times10^{17}$ atoms/cm$^3$.

Curve 40 illustrates a current/voltage characteristic of a transistor (produced at $V_{GS}$=0V) that was not biased before the characteristic was measured.

Curve 41 illustrates a current/voltage characteristic of the transistor (produced at $V_{GS}$=0V) after a stress taking the form of a voltage=$V_{GS}$=−6V and $V_{DS}$=40V was applied before the characteristic was measured.

It may be seen that the curve 41 of $I_{DS}$ as a function of $V_{DS}$ is modified with respect to the initial curve 40. The current/voltage characteristic is degraded, with, in this example, a relative variation of 60% in the current $I_{DS}$ (and therefore in the available power) at a voltage $V_{DS}$ of 5 V.

A second solution is to produce a composite buffer, for example a GaN/$Al_xGa_{1-x}N$ buffer such as illustrated in FIG. 5, with a GaN channel. In this case, the negative piezoelectric charge that appears at the GaN/$Al_xGa_{1-x}N$ interface 50 creates a potential barrier allowing the electrons to be confined in the channel. The $Al_xGa_{1-x}N$ layer must contain a few percent of aluminum (typically 3% to 10%) to obtain a good confinement of the electrons for a maximum operating voltage comprised between 20 V and 40 V and a gate length smaller than 0.25 μm.

However, the thermal conductivity of $Al_xGa_{1-x}N$ is lower than that of GaN by a factor comprised between 3 and 5 for the aluminum contents required for a good confinement of the electrons. The thermal resistance of the transistor is thus greatly degraded (multiplied by 2 to 3) and the power able to be emitted decreased by a factor of 1.5 to 3 (depending on the targeted applications) with this solution.

One aim of the invention is to mitigate the aforementioned drawbacks by providing a stack optimized for a HEMT transistor and allowing the HEMT transistor produced from this stack to exhibit good current/voltage characteristics, reflecting a good confinement of the electrons in the channel and a low current dispersion, including when the transistor must operate at high frequency (small gate dimensions) or at high drain voltages $V_{DS}$.

SUMMARY OF THE INVENTION

More precisely, the subject of the invention is a stack along a z-axis for a high-electron-mobility field-effect transistor, comprising:

a buffer layer comprising a first semiconductor material comprising a binary or ternary or quaternary nitride compound and having a first bandgap, a barrier layer comprising a second semiconductor material comprising a binary or ternary or quaternary nitride compound and having a second bandgap, the second bandgap being wider than the first bandgap, a heterojunction between said buffer layer and said barrier layer and, a two-dimensional electron gas located in an xy plane perpendicular to the z-axis and in the vicinity of the heterojunction, characterized in that:

said buffer layer comprises a zone comprising fixed negative charges of density per unit volume higher than or equal to $10^{17}$ cm$^{-3}$, said zone having a thickness smaller than or equal to 200 nm, the product of multiplication of the density per unit volume of fixed negative charges by the thickness of the zone being comprised between $10^{12}$ cm$^{-2}$ and $3.10^{13}$ cm$^{-2}$.

Preferably, the zone comprises acceptor-type impurities introduced into said buffer layer to generate the fixed negative charges.

Preferably, the acceptor-type impurities are carbon or iron or magnesium.

Preferably, the density per unit volume of fixed negative charges at thermodynamic equilibrium is substantially equal to the density per unit volume of acceptor-type impurities introduced into said zone Vf of the buffer layer.

Preferably, the density per unit volume of fixed negative charges is higher than or equal to $10^{18}$ cm$^{-3}$, the thickness of the zone is smaller than or equal to 40 nm, the product of multiplication of the density per unit volume of fixed negative charges by the thickness of the zone is lower than or equal to $4\times10^{12}$ cm$^{-2}$, and these charges are located at a distance from the heterojunction smaller than or equal to 40 nm.

Preferably, the first semiconductor material comprises GaN.

Preferably, the second semiconductor material comprises AlN, AlGaN, InAlN, InGaAlN or BGaAlN.

According to one variant, the density per unit volume of fixed negative charges has a top-hat-shaped profile along the z-axis.

According to another variant, the density per unit volume of fixed negative charges has a trapezoidal profile along the z-axis, said trapezoidal profile having a first increasing slope then a constant value then a second decreasing slope.

According to another variant, the density per unit volume of fixed negative charges has a bell-shaped profile along the z-axis.

According to one embodiment, the buffer layer is a composite and comprises a first buffer layer based on GaN material and a second buffer layer based on AlGaN material, the zone Vf being contained in the first buffer layer.

According to another aspect, the subject of the invention is a high-electron-mobility field-effect transistor produced from a stack according to the invention.

According to one embodiment, the transistor has a gate length Lg and the distance to the heterojunction from the zone is smaller than or equal to the gate length Lg.

Preferably, the product of multiplication of the density per unit volume of fixed negative charges by the thickness of the zone respects the following relationship:

$$[Fv] \cdot t = (1 \pm 0.3) \times 10^{13} \times V_{DSMAX}/Lg$$

in which:
Lg is the gate length of the transistor, in nm
$V_{DSMAX}$ is the maximum voltage applied to between the source and drain of the transistor, in volts, and
$[Fv] \cdot t$ is expressed in $cm^{-2}$.

BRIEF DESCRIPTION OF THE DRAWINGS

Other features, aims and advantages of the present invention will become apparent on reading the following detailed description given with reference to the appended drawings, which are given by way of nonlimiting example, and in which.

DETAILED DESCRIPTION OF THE INVENTION

Figure 6:
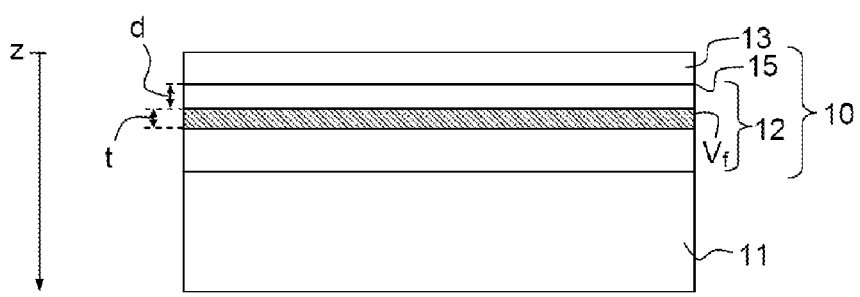
FIG. 6 illustrates a or field-effect-transistor (HEMT) stack according to the invention.

FIG. 6 illustrates a high-electron mobility field-effect transistor (HEMT) stack 10 according to the invention.

The stack 10 according to the invention is produced on a substrate 11 of the type conventionally used for this type of component.

The stack 10 comprises a plurality of layers in an xy plane perpendicular to a z-axis. By convention, the stack is said to be stacked "along the z-axis".

The stack 10 comprises a buffer layer 12 comprising a first semiconductor material comprising a binary or ternary nitride compound and having a first bandgap. The first semiconductor material is what is conventionally called a "wide bandgap" semiconductor material.

Preferably, the first semiconductor material comprises GaN. As a variant it comprises AlGaN and more precisely $Al_xGa_{1-x}N$, where x is typically comprised between 1% and 35%. The buffer layer is deposited on the substrate 11. This layer is thick enough to guarantee a good crystal quality for the material at the interface with the barrier layer where the conductive channel forms.

The stack also comprises a barrier layer 13 comprising a second semiconductor material comprising a binary or ternary or quaternary nitride compound and having a second bandgap.

According to one variant, the barrier layer comprises AlN.

According to a second variant, the barrier layer preferably comprises AlGaN or InAlN, and more precisely $Al_xGa_{1-x}N$ or $In_yAl_{1-y}N$ where x is typically comprised between 15% and 35% and y is typically comprised between 15% and 25%.

According to a third variant, the barrier layer comprises BAlGaN or InGaAlN.

The second bandgap is wider than the first bandgap, in accordance with the conventional structure of a HEMT transistor stack.

The stack comprises a heterojunction 15 between the buffer layer 12 and the barrier layer 13 and a two-dimensional electron gas 9 located in a xy-plane perpendicular to the z-axis and in the vicinity of the heterojunction 15, in accordance with the conventional structure of a HEMT transistor stack.

Preferably, the materials of the buffer and barrier layers 12, 13 are semiconductors conventionally used to fabricate HEMT transistors based on gallium (Ga).

Intermediate layers may be inserted between the buffer layer and the substrate, or between the buffer layer and the barrier layer, but are not described here for the sake of simplicity.

The buffer layer 12 of the stack according to the invention has a particular structure optimized to improve the performance of HEMT transistors produced, from the stack 10 according to the invention, by depositing gate, source and drain structures according to the prior art of HEMT transistors.

The buffer layer 12 of the stack according to the invention comprises a zone Vf comprising fixed negative charges located at a specific location in the buffer layer. The expression "fixed negative charges" is understood to mean immobile charges (mobile charges in this context means electrons or holes), the term mobile being understood in the sense that is conventional in the field of semiconductor physics. The zone Vf extends in the xy plane, is located at a distance d from the heterojunction and has a thickness t.

Figure 7:
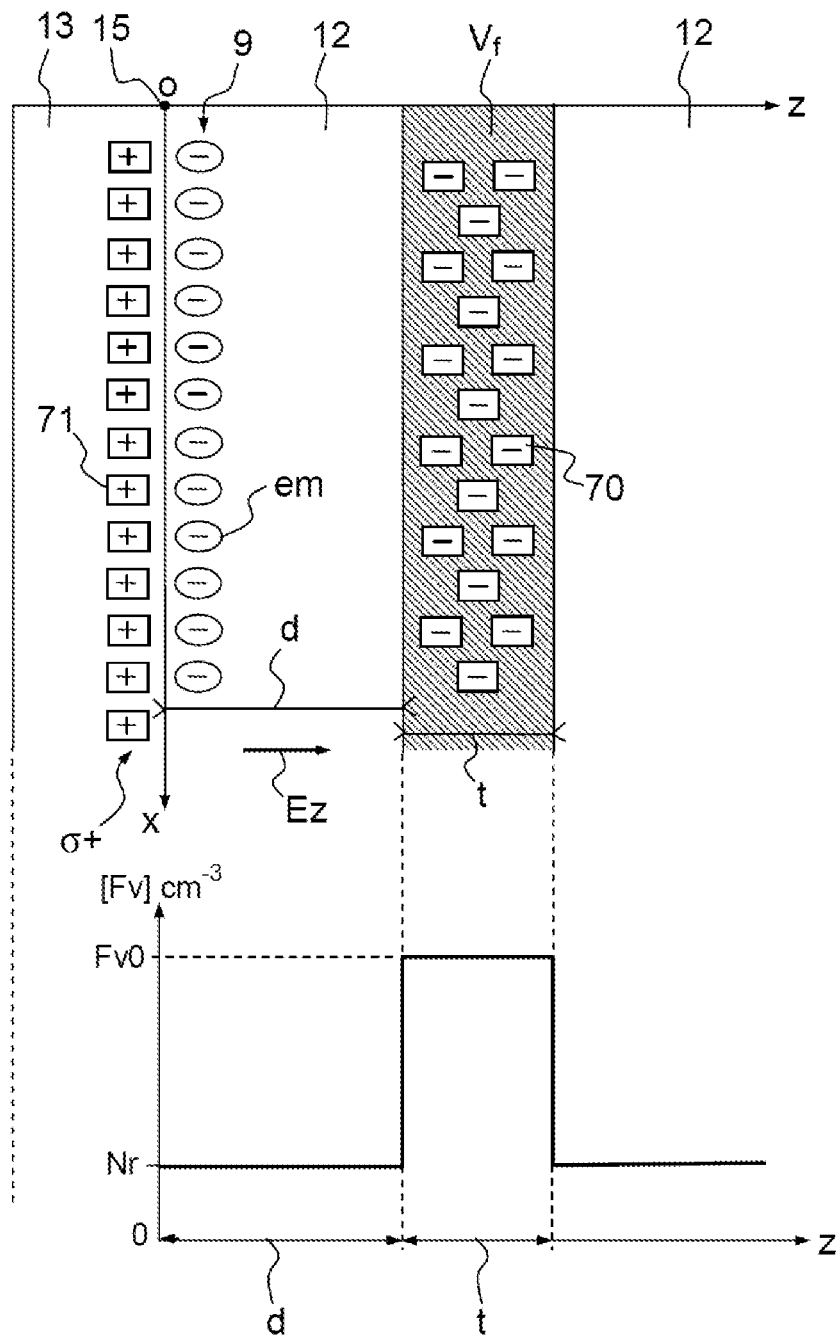
FIG. 7 more precisely describes the charge structure in the stack according to the invention.

FIG. 7 more precisely describes the distribution and nature of the charges in the stack according to the invention. The fixed nature of a charge is symbolized by a rectangle encircling the charge, whereas a mobile nature is symbolized by an oval.

As described above, because of a piezoelectric effect, a density per unit area σ+ of fixed positive charges 71 is present in the vicinity of the heterojunction, and mobile negative charges em, which are also located in proximity to the heterojunction, form the two-dimensional electron gas that is the basis of the transistor operation of the HEMT. The density per unit area of electrons em in the channel is typically about 0.5 to $3 \times 10^{13}$ cm$^{-2}$.

The zone Vf of the stack according to the invention comprises fixed negative charges 70.

These fixed negative charges have a density per unit volume [Fv], conventionally expressed in cm$^{-3}$.

After many experiments and simulations, the inventors have determined ranges for the parameters [Fv] and t of the zone Vf that guarantee a good operation, and in particular a good "pinch off" and a low current dispersion (lag effect), is obtained with a HEMT transistor produced on a stack such as described above. This good operation also means that the drawbacks associated with stacks according to the prior art, such as: decrease in the emitted power, decrease in efficiency, decrease in linearity, etc. are mitigated, or even obviated.

The general idea of the invention is to introduce into the buffer layer 12 an amount of fixed negative electric charge that is just enough to obtain good transfer characteristics at the desired operating frequencies and voltages. Controlling the amount of charge and its position with respect to the 2D electron gas allows:

a good confinement of the electrons in the channel to be obtained without creating undesirable trapping effects that lead to a degradation in linearity (dispersive effects) and a decrease in available power and efficiency, without degrading the thermal conductivity of the buffer, which is for example made of GaN.

The parameters [Fv] and t are related to physical quantities affecting the operation of the HEMT transistor produced from the stack 10 according to the invention.

A first physical quantity is the electric field E created because of the existence of the zone Vf.

The electric field E along the z-axis Ez created between the heterojunction 15 and the zone Vf respects the relationship:

$$\mathrm{div} E_z = q \cdot [Fs]/\epsilon_0 \cdot \epsilon_r.$$

where: q is the charge on an electron, $\epsilon_0$ is the dielectric permittivity of vacuum, $\epsilon_r$ is the relative permittivity of the buffer layer, and [Fs] the negative electric charge density per unit area "seen" by the movable charges em in the channel (expressed in cm$^{-2}$).

$$[Fs] \approx [Fv] \cdot t.$$

The presence of the electric field Ez created by the zone Vf of negative charge has the effect of confining the electrons in the channel, thereby allowing a "good pinch off" to be obtained.

Thus, in order for this field Ez is to be sufficient to confine the electrons, the inventors have demonstrated that the quantities [Fv] and t must be comprised in the following ranges:

$[Fv] \geq 10^{17}$ cm$^{-3}$ $t \leq 200$ nm $10^{12}$ cm$^{-2} \leq [Fv] \cdot t \leq 3 \times 10^{13}$ cm$^{-2}$.

The parameter [Fv]·t represents the dose of negative charges, which must be optimal and placed in proximity to the interface 15.

One advantage of the invention is that the location and dose of the introduced negative charges allows the amount of charge that is just enough to ensure electron confinement to be introduced (this amount moreover depending on the operating voltage and gate length as described below), while limiting the loss of power with respect to an approach in which the entirety of the buffer is "doped" with acceptor-type impurities.

The claimed ranges must also be respected to ensure a low current dispersion, as described below.

The fixed negative charge density per unit volume profile along the z-axis may be of any shape, the shape not having a first-order effect on the physical effects at work.

FIG. 7 illustrates a profile of top-hat shape of constant value Fv0.

The minimum value Nr corresponds to the residual density of fixed negative charges in the buffer layer 12, for what is called a "compensated" buffer layer in the prior art. In this case, the buffer layer in its entirety contains an excess concentration of acceptor-type impurities, with respect to the concentration of donor-type impurities, higher than $10^{15}$ cm$^{-3}$ and corresponding to the residual density Nr.

FIGS. 8a-8d illustrate various shapes of density per unit volume [Fv] profile according to the invention.

Figure 8A:
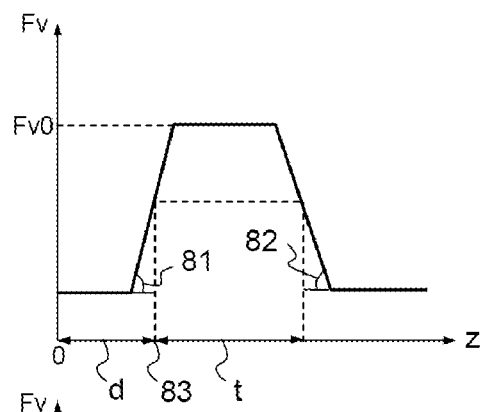
FIGS. 8a-8d illustrate various fixed negative charge density per unit volume profile shapes.
Figure 8B:
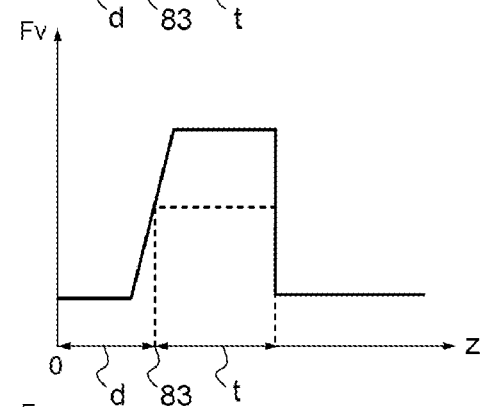
Figure 8C:
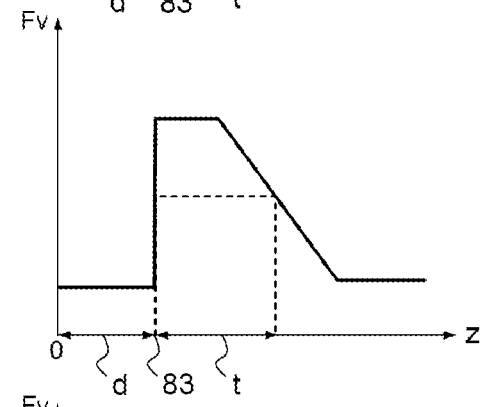
Figure 8D:
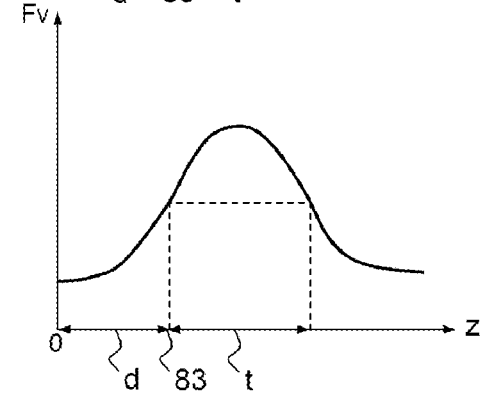

FIG. 8a illustrates a trapezoidal profile having an increasing first slope 81 then a constant value Fv0 then a decreasing second slope 82. FIG. 8b illustrates a profile having an increasing first slope, a constant value and an abrupt second slope. FIG. 8c illustrates a profile having an abrupt first slope, a constant value and a decreasing second slope. FIG. 8d illustrates a bell-shaped profile.

The stack 10 according to the invention may have any other type of profile corresponding to a density of charge per unit volume contained in a thickness t meeting the above conditions. For a given profile, the thickness t may be evaluated at half maximum between the maximum value and the residual value. The distance d to the heterojunction 15 may be evaluated with respect to the point 83 corresponding to the point at half maximum on the side of the heterojunction 15.

Preferably, the fixed negative charges 70 located in the buffer layer 12 are obtained from acceptor-type impurities A introduced into the buffer layer 12. These acceptor-type atoms are preferably carbon or iron, or magnesium or beryllium or any type of impurity known to be an acceptor center in GaN or AlGaN.

These impurities are for example introduced by varying the epitaxial growth conditions of the buffer layer 12 or by intentionally introducing these impurities during the growth of the buffer layer 12.

These impurities A do not perform a doping function in the conventional sense of the term, since they form deep centers.

These acceptor-type impurities interact electrostatically with the fixed positive charges 71 that form in the charge plane σ+ located in the vicinity of the heterojunction 15, and their degree of ionization depends on their distance d to this heterojunction 15 and on their position in the bandgap of the material making up the buffer layer.

A second physical quantity affecting the operation of the HEMT transistor produced from the stack according to the invention is the parameter Δ defined as follows, and illustrated in FIG. 9.

$$\Delta = \int_0^t ([A] - [A^-]) \cdot dz \text{ (in cm}^{-2}\text{)}$$

Where:

[A] is the density per unit volume of impurities A (also denoted defects) of acceptor-type introduced into the buffer layer 12. Therefore [A]=[Fv]; and

[A⁻] is the density per unit volume of impurities that are said to be "charged" or "ionized" by electrostatic interaction (ionization of the defect that follows capture of an electron by the deep center), each "charged" impurity corresponding to a fixed negative charge "set" by electrostatic interaction.

We will now explain the physical meaning of the quantity Δ, and to do so specify the meaning of the terms "set" and "not set".

An acceptor center has two possible states: either it is occupied by an electron and is then negatively charged, or it is empty and in this case neutral. The degree of occupation of the centers (i.e. the number of centers occupied by an electron and therefore the amount of negative charge associated with the centers) depends on the operating conditions (frequency, temperature and voltage). As a result, power level depends on the operating conditions.

Since these impurities are deep centers at the operating temperature of the transistor (typically 25° C. to 250° C.), the time required for these centers to reach their equilibrium state is longer than the characteristic operating times of the transistor (typical operating frequencies of about 1 GHz to 100 GHz, which correspond to voltages that change periodically about every 1 ns to 10 ps).

Therefore, these centers do not immediately respond to the applied signal. It follows that the negative charge borne by these impurities and therefore power and current level depends on time and on the various applied voltages. Therefore, the signal is observed to vary over time independently of the signal applied at time t, which decreases linearity.

However, if these impurities are close enough to the interface, then, by electrostatic interaction, some of these impurities (those closest to the interface) will be charged whatever the voltage applied to the transistor. Their state then no longer depends on the operating conditions of the transistor. A more linear transistor operation and a lesser dispersive effect will then be obtained. The quantity Δ quantifies these dispersive effects—it represents the number of fixed negative charges the state of which depends on the operating conditions.

Thus, in this context, the term "set" means that the state of the acceptor center does not depend on the operating conditions, and the term "not set" means that the state of the acceptor center depends on the operating conditions.

The quantity Δ is defined by the number of impurities, here negative impurities, introduced into the buffer layer to improve the pinch off (and therefore the gain of the transistor) minus the number of impurities the state of which is "set" by the presence of piezoelectric charge. Δ therefore represents the residual not-set impurities the state of charge of which varies depending on the operating conditions (temperature, frequency, voltage). In other words, Δ represents the number of impurities per unit area that do not capture an electron (i.e. that are "not set") and the state of which will depend on the operating conditions. These centers will therefore potentially be able to capture an electron, the amount of acceptor centers that capture an electron depending on the operating conditions.

Figure 9:
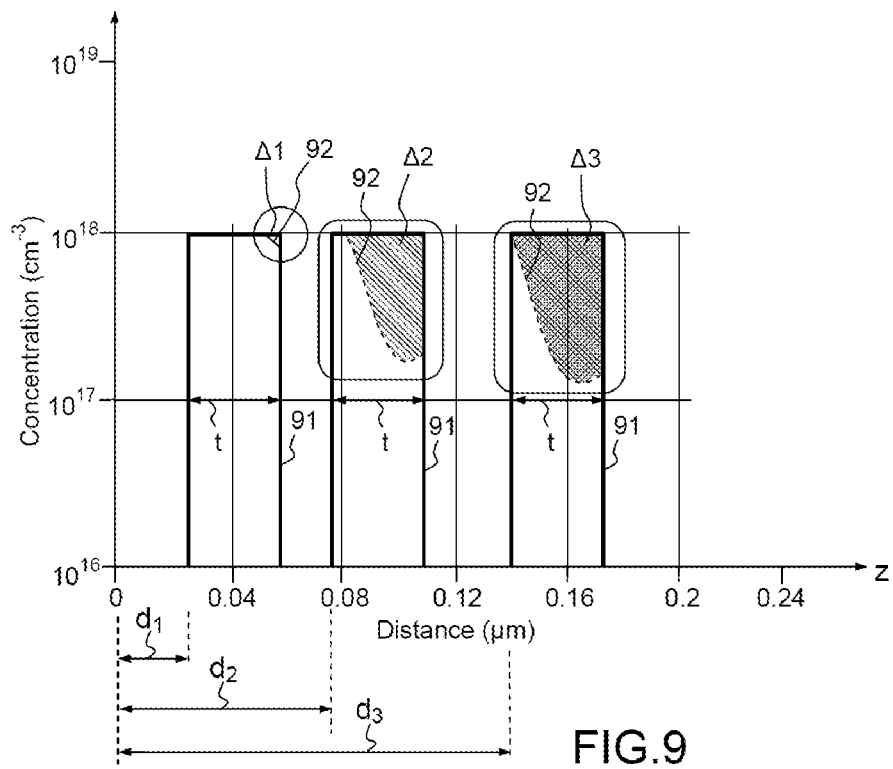
FIG. 9 schematically shows the difference between the profile of introduced impurities and the profile of charged impurities for three values of the distance d between the zone Vf and the heterojunction.

Profile 91 (solid line) in FIG. 9 correspond to the initial profile [A] and the profile 92 (dashed line) corresponds to the profile [A⁻].

The difference between the two profiles corresponds to the hatched area Δ in FIG. 9.

The simulations to calculate the profile [A⁻] were carried out for three values of the distance d to the heterojunction 15, d1=25 nm, d2=75 nm, d3=140 nm, and with the following assumptions:

Acceptor-type impurities introduced into the buffer layer with a density per unit volume $[A]=10^{18}$ cm$^{-3}$ and forming a zone Vf having a top-hat-shaped profile and a thickness t=40 nm and the energy level $E_T$ of which in the bandgap of the material making up the buffer layer was $E_T=E_V+0.9$ eV.

In addition, the gate length Lg of the transistor produced on the stack was, in this example, 150 nm, which corresponds to what is called a "short" gate. The various targeted applications require gate sizes of typically less than 4 μm. The inventors have demonstrated that the performance of the transistor depends on the distance d to the heterojunction of the zone Vf, this dependence depending on the size of the gate Lg.

When the HEMT transistor is biased (in this case $V_{GS}=-3$ V and $V_{DS}=40$ V), impurities that are not initially charged (A) will charge. During a return to $V_{GS}=-3$V and $V_{DS}=40$V, as these impurities are deep centers they remain charged at the operating frequencies of the transistor. Thus, impurities the negative charge of which is not set by electrostatic effect have a state that is modified by the application of a voltage. This modification causes a variation in the current and therefore in the available power (decrease or increase depending on whether the voltage biasing the transistor is increased or decreased).

It may be seen in FIG. 9 that the number of not-set charges (and therefore the current dispersion) increases as the distance of the zone Vf to the heterojunction, which is located at the origin O, increases.

Also they also be seen that, for a given distance d, these charges appear on the side opposite that of the heterojunction 15. Specifically, on the side of the heterojunction, the impurities are closer to the fixed positive charges, and therefore the electrostatic interaction with the density per unit area σ+ is stronger and allows the state of the charges to be set.

Figure 10:
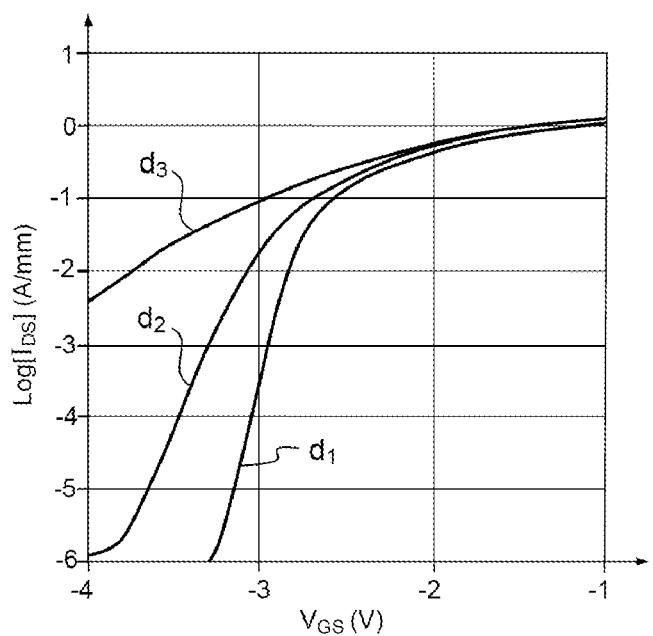
FIG. 10 illustrates the $Log[I_{DS}]=f(Vgs)$ characteristic for a HEMT transistor produced with the stack according to the invention, for three values of the distance d between the zone Vf and the heterojunction.

In the example given in FIG. 9 (maximum voltage applied to the drain of the transistor of 40 V), the physical simulation indicates:

$\Delta 1 \approx 0.1 \times 10^{12}$ cm$^{-2}$
$\Delta 2 \approx 1.9 \times 10^{12}$ cm$^{-2}$
$\Delta 3 \approx 2.7 \times 10^{12}$ cm$^{-2}$ FIG. 10 illustrates the Log $[I_{DS}]=f(V_{GS})$ characteristic for a HEMT transistor produced with the stack according to the invention described above, for a quiescent point (QP) of $I_{DS\_QP}=100$ mA/mm ($V_{GS\_MAX}=-6$V in this example) and $V_{DS\_QP}=20$V ($V_{DS\_MAX}=2 \times V_{DS\_QP}=40$V) and for zones Vf produced at the three preceding distances. It may be seen that the characteristic is very good for d1=25 nm, a little less good for d2=75 nm and poor for d3=140 nm.

Figure 11:
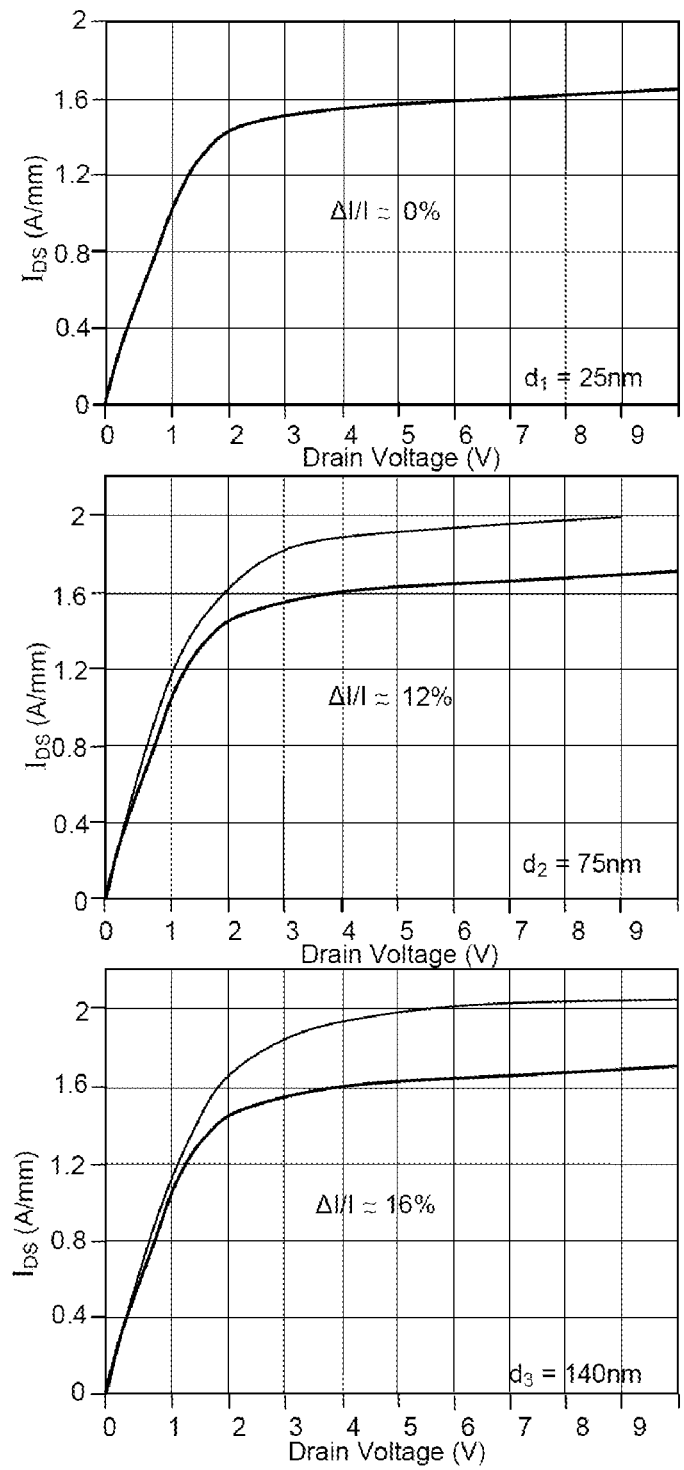
FIG. 11 illustrates current dispersion for three values of the distance d between the zone Vf and the heterojunction.

FIG. 11 illustrates the current dispersion such as explained above for the three aforementioned preceding cases. It may be seen that this dispersion increases as d increases.

Thus, for a "short" gate of length Lg typically smaller than 200 nm, a good transistor operation is obtained with a zone Vf located at a distance d<100 nm from the heterojunction 15.

If the distance d is too large, the not-set trapped charges become too numerous, and an effect analogous to that observed by the inventors for a buffer layer the entirety of which is uniformly p-doped is observed (poor pinch off and current dispersion). Too large a distance d also decreases the electric field Ez confining the electrons.

Figure 12:
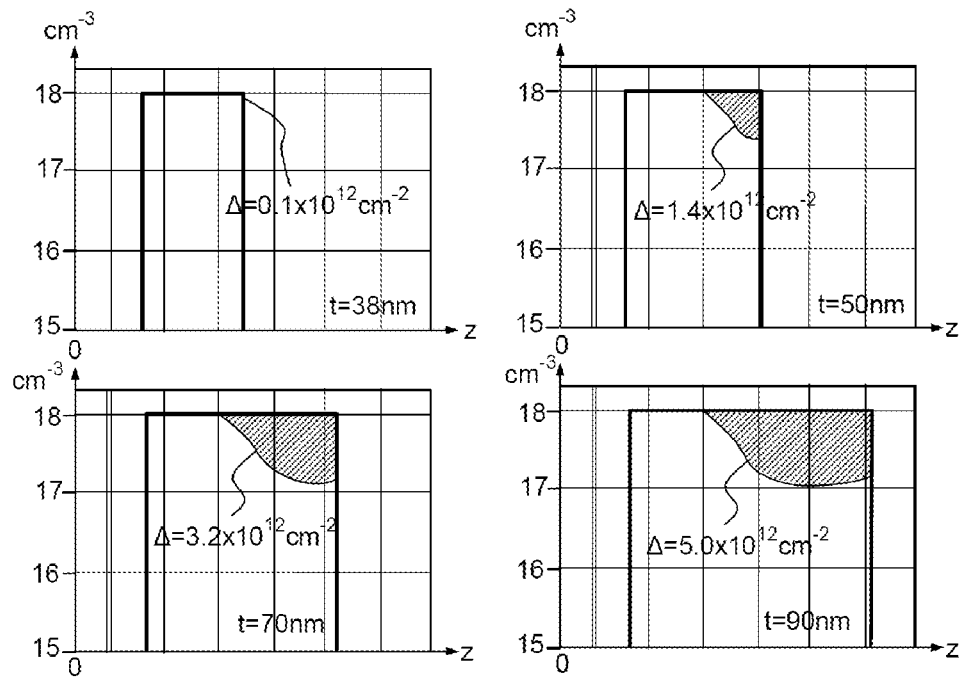
FIG. 12 schematically shows the difference between the profile of introduced impurities and the profile of charged impurities for three values of the thickness t of the zone Vf.

FIG. 12 illustrates the variation in the parameter $\Delta$ as a function of the thickness t of a zone Vf having a top-hat-shaped profile and containing acceptor-type impurities with a density per unit volume $[A]=10^{18}$ cm$^{-3}$ and the energy level $E_T$ of which in the bandgap of the material making up the buffer layer is $E_T=E_V+0.9$ eV.

The more the value of t increases (from 38 nm to 90 nm) the more the value of $\Delta$ increases. The maximum thickness t value for which the transistor preserves a good operation also depends on the density [A] of impurities introduced and the distance to the heterojunction d.

It will be clear from the above considerations presented with regard to FIGS. 9 to 12 that, to obtain the most linear operation possible with a transistor produced on a stack according to the invention, and in order to decrease the loss of transistor power and efficiency, it should be sought to minimize the parameter $\Delta$.

A value of $\Delta$ close to 0 corresponds to the situation in which the density per unit area of fixed negative charges $\int_0^t [A^-]\cdot dz$ is substantially equal to the density per unit area of acceptor-type impurities $\int_0^t [A]\cdot dz$ introduced into the zone Vf of the buffer layer 12.

An optimum condition corresponds to a value of $\Delta$ such that:

$\Delta \leq 10^{12}$ cm$^{-2}$

To achieve this, a sufficiently high concentration per unit volume [Fv] of impurities must be placed at a sufficiently small distance d from the interface 15 (so as to make the thickness t of this layer as small as possible for a given product [Fv]·t) to ensure all the introduced impurities have charges in the set state (all the dopants are ionized and remain so under all the expected operating conditions). In this situation, dispersion in the transconductance gm and the current over time is decreased, this being an advantage in applications in which signal linearity aspects are important.

This condition is for example met with a stack according to the invention for a HEMT transistor with:

[Fv]$\geq 10^{18}$ cm$^{-3}$
t$\leq$40 nm.
[Fv]·t$\leq 4\times 10^{12}$ cm$^{-2}$
and d$\leq$40 nm.

To a first approximation, this preferable condition is independent of the length of the gate Lg of the transistor produced from the stack.

According to another aspect, the invention relates to a high-electron-mobility field-effect transistor produced from a stack according to the invention.

In addition, following many experiments and simulations, the inventors have determined preferable conditions to be met, as regards the dimensions of the HEMT transistor according to the invention, i.e. produced from the stack according to the invention, depending on the desired application.

During operation of the transistor, some of the impurities introduced into the buffer to improve "pinch off" charge negatively. These fixed charges correspond to impurities that pass from a neutral state (no captured electron) to a negatively charged state (capture of an electron by the deep center). The amount of impurities that capture an electron depends on the operating conditions (temperature, frequency, voltage) and the characteristics (d, t and [Fv]) of the profile of these impurities.

The inventors have demonstrated that good transistor operation is preferably obtained when the distance d is smaller than or equal to the length of the gate Lg of the transistor according to the invention: d$\leq$Lg.

By simulation, it is possible to establish a semi-empirical relationship giving the density per unit area of fixed charges (in cm$^2$) to be produced in the stack, as a function of the gate length Lg and the maximum voltage applied to the drain $V_{DSMax}$. This relationship has been validated by simulation for an electron density in the channel of up to $3\times 10^{13}$/cm$^2$, for a gate length Lg comprised between 50 nm and 4 μm, and a voltage $V_{DSMax}$ of up to a few kV (for the longest gates) and is:

$$[Fv]\cdot t = [Fs_{opt}] = (1\pm 0.3)\times 10^{13}\times V_{DSMAX}/Lg \quad \text{(relationship no. 1)}$$

where [Fs$_{opt}$] is in cm$^{-2}$, Lg in nm and $V_{DSMAX}$ in V for example, for a maximum operating voltage $V_{DSMAX}$ of 40 V and a gate length of 150 nm, it is necessary to achieve:

$$[Fs_{opt}] = (1\pm 0.3)\times 10^{13}\times 40 \, V/150 \, nm,$$

namely about $(2.7\pm 0.8)\times 10^{12}$ fixed charges/cm$^2$.

In the following three examples, the case where $\Delta\approx 0$ is considered i.e. $\Delta<10^{12}$/cm$^2$ (the most favorable case from the point of view of signal dispersion). Furthermore, t=40 nm, and [Fv]=1018 cm−3, respectively i.e. [A]=[Fv]·t=4× 1012 cm$^2$.

Relationship 1 may be written in two equivalent forms depending on the parameter (gate length or maximum operating voltage) that it is sought to optimize:

If it is the voltage:

$$V_{MAX} = Lg\times ([Fv]^*t)/((1\pm 0.3)\times 10^{13}) \quad \text{(relationship no. 2)}$$

If it is the gate length then:

$$Lg = V_{MAX}\times ((1\pm 0.3)\times 10^{13})/([Fv]^*t) \quad \text{(relationship no. 3)}$$

Satellite telecommunications applications at 30 GHz:

In these applications the gate length is comprised between 50 nm and 150 nm. Relationship number n °2 is used and the following found:

for a gate length Lg=50 nm: $V_{MAX}\approx$15 V to 28V for a gate length Lg=150 nm: $V_{MAX}\approx$45 V to 85V Envelope-tracking type communications application:

In this case it is desired to obtain the shortest possible gate (shortest switching time) able to operate at 60 V. Relationship no 3 is used and the following obtained:

$$Lg = V_{MAX}\times (1\pm 0.3)\times 10^{13}/([Fv]^*t) = 60\times (1\pm 0.3)\times 10^{13}/(4\times 10^{12})$$

$$\approx 100 \text{ nm to } 200 \text{ nm.}$$

Automotive power-switching application:

In this case it is desired for the transistor to be able to withstand voltages of 650 V to 1300 V. The gate length must therefore be about:

For 650 V:

$$Lg = V_{MAX} \times (1 \pm 0.3) \times 10^{13} / ([Fv]^* d) = 650 \times (1 \pm 0.3) \times 10^{13} / (4 \times 10^{12})$$
$$\approx 1 \text{ μm to } 2 \text{ μm.}$$

For 1300 V:

$$Lg = V_{MAX} \times (1 \pm 0.3) \times 10^{13} / ([Fv]^* d) = 1300 \times (1 \pm 0.3) \times 10^{13} / (4 \times 10^{12})$$
$$\approx 2 \text{ μm to } 4 \text{ μm.}$$

The stack according to the invention is compatible with the use of a composite buffer layer 12 comprising a first buffer layer based on GaN material and a second buffer layer based on AlGaN material.

Figure 1:
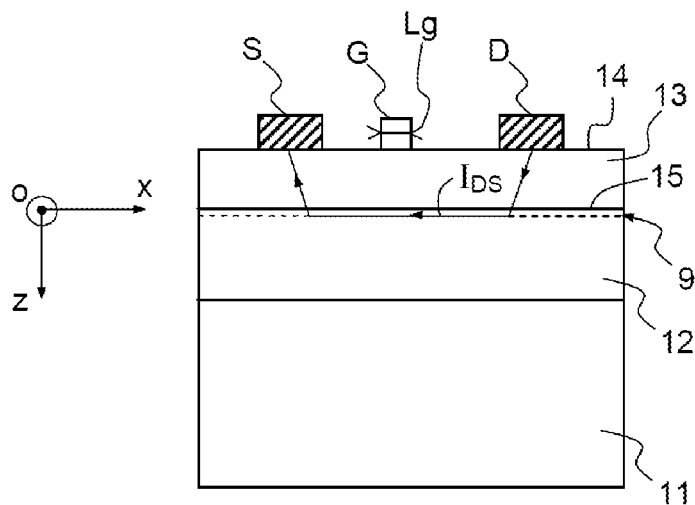
FIG. 1, which was discussed above, schematically shows a cross section through the structure of a conventional HEMT transistor.
Figure 2:
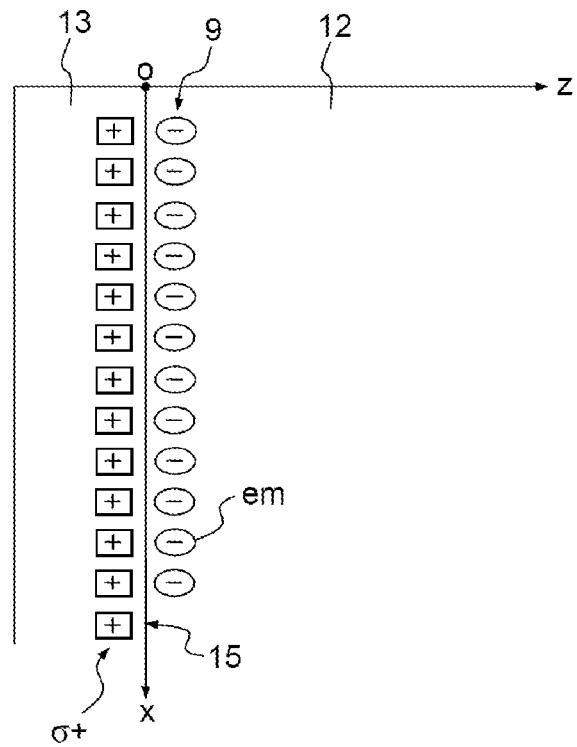
FIG. 2, which was discussed above, shows the charge distribution in the vicinity of the heterojunction of the conventional HEMT transistor.
Figure 3:
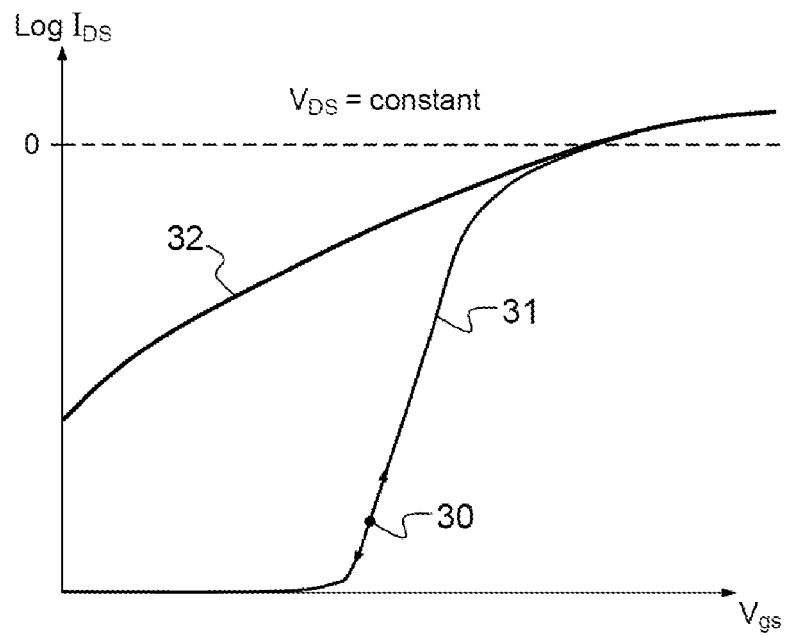
FIG. 3, which was discussed above, schematically shows the current/voltage characteristic of a HEMT transistor having a good and poor "pinch off"
Figure 4:
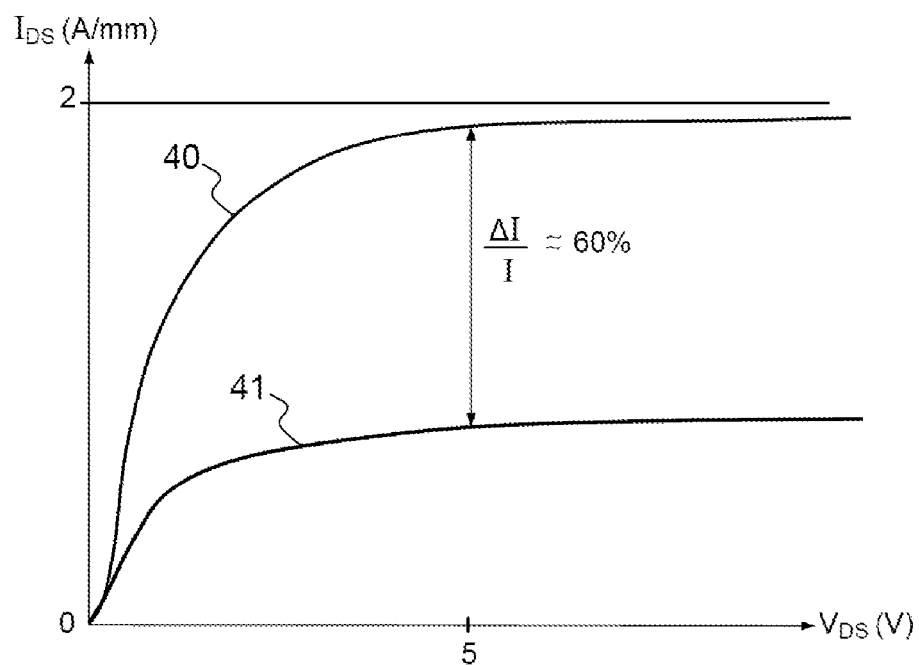
FIG. 4, which was discussed above, schematically illustrates the behavior of a HEMT transistor according to the prior art exhibiting current dispersion.
Figure 5:
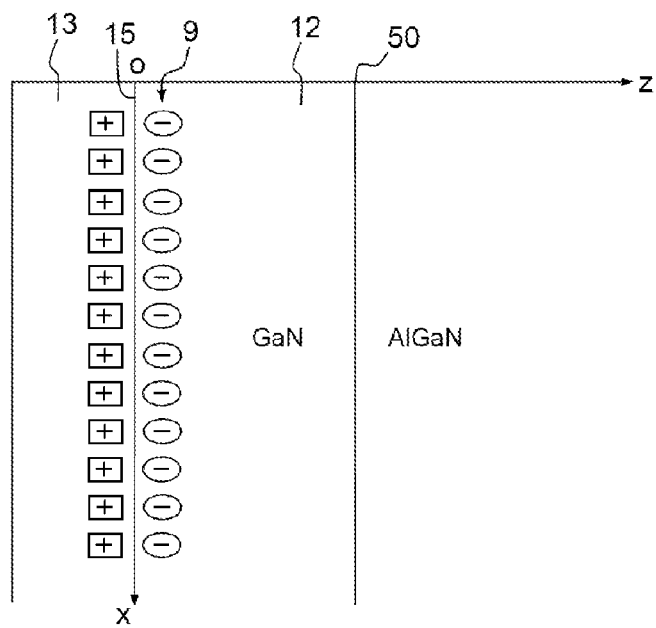
FIG. 5, which was discussed above, schematically illustrates a stack of a transistor according to the prior art comprising a composite buffer layer.

The interface between the GaN and AlGaN is referenced 50 (see FIG. 5). The presence of a zone Vf according to the invention allows the percentage of aluminum in the AlGaN material to be decreased, for example below 5%, this having the advantage of decreasing the increase in the thermal resistance of the second buffer layer.

Figure 13:
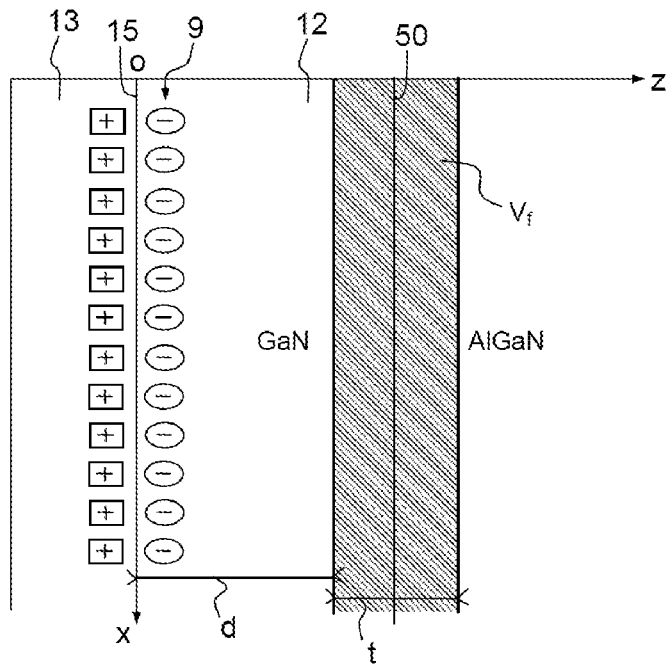
FIG. 13 illustrates one variant of the stack according to the invention comprising a composite buffer layer.

According to one preferred variant illustrated in FIG. 13, the zone Vf is contained in the first buffer layer.

According to another variant, the zone Vf is comprised in the second buffer layer.

According to another variant, the zone Vf comprises the interface 50.

The invention claimed is:

1. A stack along a z-axis for a high-electron-mobility field-effect transistor, comprising:
   a buffer layer comprising a first semiconductor material comprising a binary or ternary or quaternary nitride compound and having a first bandgap,
   a barrier layer comprising a second semiconductor material comprising a binary or ternary or quaternary nitride compound and having a second bandgap,
   the second bandgap being wider than the first bandgap,
   a heterojunction between said buffer layer and said barrier layer and,
   a two-dimensional electron gas located in an xy plane perpendicular to the z-axis and in the vicinity of the heterojunction,
   wherein:
   said buffer layer comprises a zone (Vf) comprising fixed negative charges of density per unit volume ([Fv]) higher than or equal to $10^{17}$ cm$^{-3}$, said zone (Vf) having a thickness (t) smaller than or equal to 200 nm, the product of multiplication of the density per unit volume of fixed negative charges ([Fv]) by the thickness (t) of the zone (Vf) being comprised between $10^{12}$ cm$^{-2}$ and $3.10^{13}$ cm$^{-2}$.

2. The stack as claimed in claim 1, wherein a density per unit area of fixed negative charges ($\int_0^t [A^-] \cdot dz$) is substantially equal to a density per unit area of acceptor-type impurities ($\int_0^t [A] \cdot dz$) introduced into the zone (Vf) of the buffer layer.

3. The stack as claimed in claim 1, wherein the density per unit volume of fixed negative charges ([Fv]) is higher than or equal to $10^{18}$ cm$^{-3}$, the thickness (t) of the zone (Vf) is smaller than or equal to 40 nm, the product of multiplication of the density per unit volume of fixed negative charges ([Fv]) by the thickness (t) of the zone (Vf) is lower than or equal to $4 \times 10^{12}$ cm$^{-2}$, and the distance (d) from the zone (Vf) to the heterojunction is smaller than or equal to 40 nm.

4. The stack as claimed in claim 1, wherein the first semiconductor material comprises GaN.

5. The stack as claimed in claim 1, wherein the second semiconductor material comprises AlN, AlGaN, InAlN, InGaAlN or BAlGaN.

6. The stack as claimed in claim 1, wherein the density per unit volume of fixed negative charges ([Fv]) has a top-hat-shaped profile along the z-axis.

7. The stack as claimed in claim 1, wherein the density per unit volume of fixed negative charges ([Fv]) has a trapezoidal profile along the z-axis, said trapezoidal profile having a first increasing slope then a constant value then a second decreasing slope.

8. The stack as claimed in claim 1, wherein the density per unit volume of fixed negative charges ([Fv]) has a bell-shaped profile along the z-axis.

9. The stack as claimed in claim 1, wherein the buffer layer is a composite comprising a first buffer layer based on GaN material and a second buffer layer based on AlGaN material, said zone (Vf) being contained in the first buffer layer.

10. The stack as claimed in claim 1, wherein said zone (Vf) comprises acceptor-type impurities (A) introduced into said buffer layer to generate the fixed negative charges.

11. The stack as claimed in claim 10, wherein the acceptor-type impurities are carbon or iron or magnesium.

12. A high-electron-mobility field-effect transistor produced from a stack according to claim 1.

13. The transistor as claimed in claim 12 having a gate length (Lg), wherein the distance (d) to the heterojunction from the zone (Vf) is smaller than or equal to the gate length (Lg).

14. The transistor as claimed in claim 12, wherein the product of multiplication of the density per unit volume of fixed negative charges ([Fv]) by the thickness (t) of the zone (Vf) respects the following relationship:

$$[Fv] \cdot t = (1 \pm 0.3) \times 10^{13} \times V_{DSMAX}/Lg$$

in which:
Lg is the gate length of the transistor, in nm
$V_{DSMAX}$ is the maximum voltage applied to between the source and drain of the transistor, in volts, and
[Fv]·t is expressed in cm$^{-2}$.

* * * * *